US005707452A

United States Patent [19]
Dandl

[11] Patent Number: 5,707,452
[45] Date of Patent: Jan. 13, 1998

[54] COAXIAL MICROWAVE APPLICATOR FOR AN ELECTRON CYCLOTRON RESONANCE PLASMA SOURCE

[75] Inventor: Raphael A. Dandl, San Marcos, Calif.

[73] Assignee: Applied Microwave Plasma Concepts, Inc., La Jolla, Calif.

[21] Appl. No.: 676,448

[22] Filed: Jul. 8, 1996

[51] Int. Cl.$^6$ .................................................. C23C 16/00
[52] U.S. Cl. .................... 118/723 MW; 118/723 MA; 118/723 MR; 427/575
[58] Field of Search ................... 118/723 MW, 118/723 MA, 723 MP, 723 MR; 156/345, 643; 216/69, 70; 204/298.38; 427/575

[56] References Cited

U.S. PATENT DOCUMENTS

| | | | |
|---|---|---|---|
| 4,401,054 | 8/1983 | Matsuo | 118/723 |
| 4,450,031 | 5/1984 | Ono | 156/345 |
| 4,492,620 | 1/1985 | Matsuo | 204/192 |
| 4,503,807 | 3/1985 | Nakayama | 118/719 |
| 4,534,842 | 8/1985 | Arnal | 204/192 |
| 4,564,997 | 1/1986 | Matsuo | 29/576 |
| 4,566,940 | 1/1986 | Itsumi | 156/643 |
| 5,270,616 | 12/1993 | Itatani | 315/111.21 |
| 5,292,370 | 3/1994 | Tsai et al. | 118/723 MP |
| 5,346,579 | 9/1994 | Cook et al. | 156/345 |
| 5,370,765 | 12/1994 | Dandl | 156/643 |
| 5,411,591 | 5/1995 | Izu et al. | 118/718 |
| 5,483,248 | 1/1996 | Milroy | 343/785 |
| 5,529,632 | 6/1996 | Katayama et al. | 118/723 MP |
| 5,562,775 | 10/1996 | Mihara | 118/725 MW |

OTHER PUBLICATIONS

Quon and Dandl; Preferental electron–cyclotron heating of hot electrons and formation of overdense plasma; phys. Fluids B 1 (10) Oct. 1989, pp. 2010–2017.

Guest, Fetzer and Dandl; Whistler–wave electron cyclotron heating in uniform and nonuniform magnetic fields; Phys. Fluids B2 (6) pp. 1210–1220, Jun. 1990.

Dandl and Guest; On the low–pressure mode transition on electron cyclotron heated plasma; J. Vac. Sci. Techol. A9 (6), Nov. 12 1991, pp. 3119–3125.

Rose and Clark; Plasma and Controlled Fusion; John Wiley and Sons, N.Y., 1961, pp. 198–221, Jan. 1961.

Ono, Oda, Takahashi and Matsuo; J. Vac. Techol B4, p. 696 (1986).

*Primary Examiner*—John Niebling
*Assistant Examiner*—Joni Y. Chang
*Attorney, Agent, or Firm*—Robert Charles Hill

[57] ABSTRACT

A method and apparatus are disclosed employing a microwave applicator for use with an electron cyclotron resonance (ECR) plasma source for applications including, but not limited to, etching and chemical vapor deposition. A magnetic field is generated by magnets circumferentially arranged about a chamber that is symmetrical about its longitudinal axis. The microwave applicator, which comprises one or more pairs of slotted antenna arrays, injects and distributes microwave power about the entire periphery of a plasma forming portion of the chamber. The antenna arrays include a plurality of radiating stubs for radiating microwave power. The stubs are positioned along the arrays at predetermined intervals for efficiently distributing microwave power uniformly about the periphery of the plasma forming portion. The position and orientation of the radiating stubs cause microwave power to be launched into the plasma in the form of propagating waves with a polarization suitable of electron cyclotron heating. The applicator is coupled to a microwave power source that preferably supplies microwave power at a frequency of 2.45 GHz. A magnetic-field free region produces uniformity of plasma distribution in a plasma stream that approaches an outlet in the chamber. The plasma stream flows through the plasma forming region toward the specimen with characteristics of high density, uniformity over transverse dimensions larger than the specimen, and low plasma temperature, while operating at gas pressures which can be varied over a wide range.

25 Claims, 5 Drawing Sheets

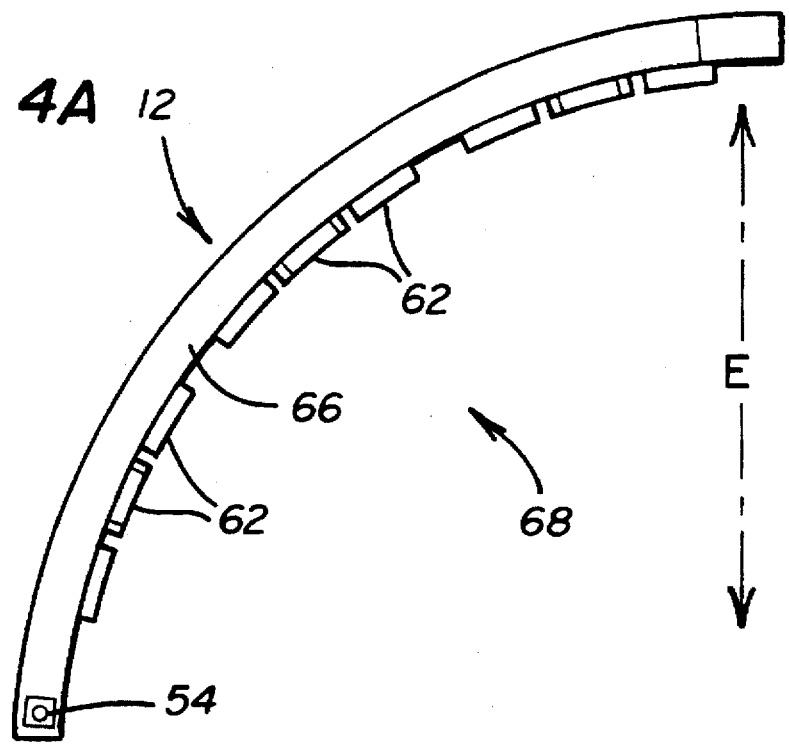
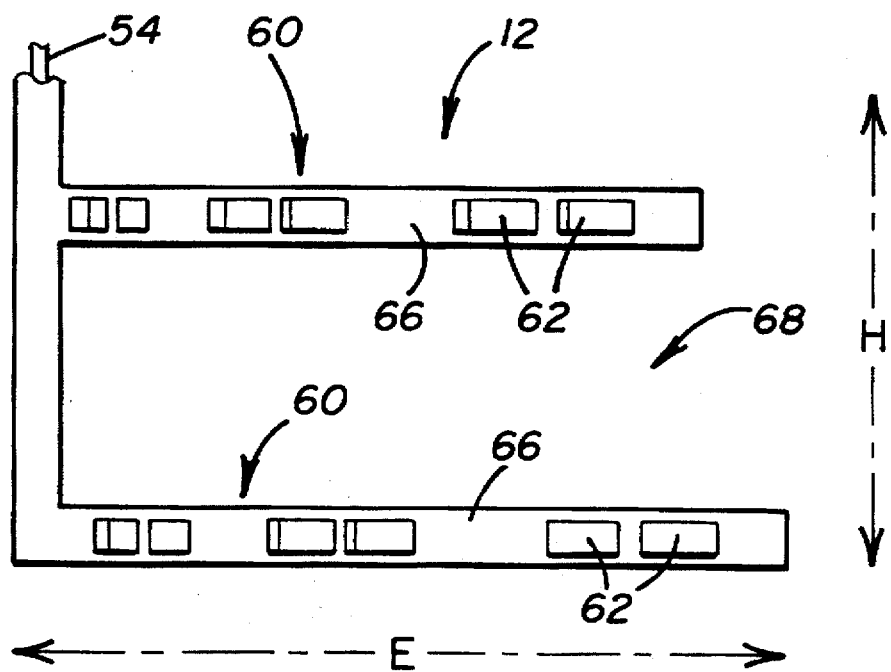

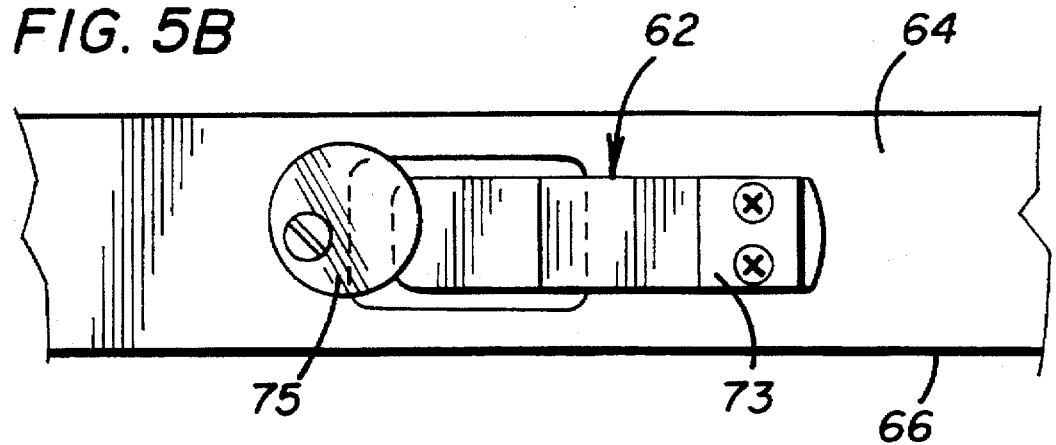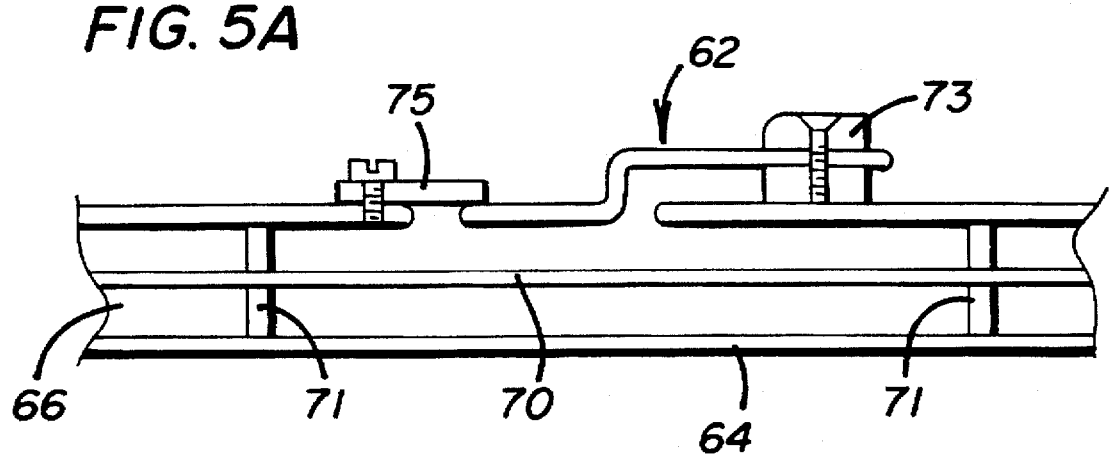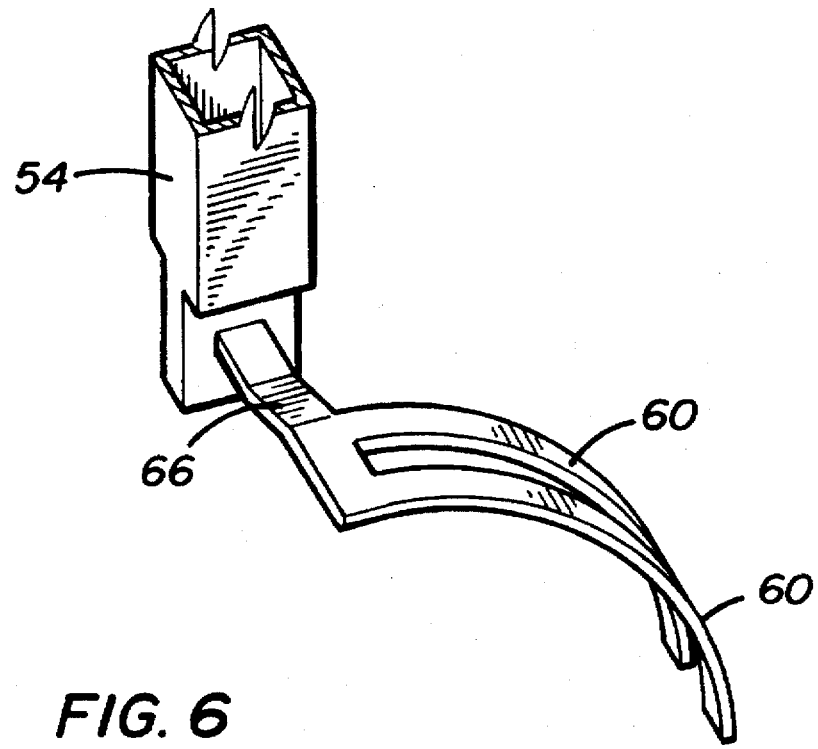

COAXIAL MICROWAVE APPLICATOR FOR AN ELECTRON CYCLOTRON RESONANCE PLASMA SOURCE

BACKGROUND OF THE INVENTION

1. Field of the Invention

The present invention relates generally to an electron cyclotron resonance heating plasma source for producing a plasma stream, such as a plasma source used in applications such as the treatment of specimens such as VLSI wafers, by applications including chemical vapor deposition, etching, and cleaning, and more particularly, to a method and apparatus employing a microwave applicator for use with an electron cyclotron resonance heated plasma source.

2. Description of Related Art

The present invention is based upon generation of cold plasma by electron cyclotron resonance heating in order to develop various desired characteristics within the plasma. More specifically, the present invention and related prior art are based upon the physical conditions governing the steady-state values of plasma density and composition, as well as the electron and ion temperatures, as determined by the applied microwave power, the ambient gas pressure and composition, and details of the magnetic field configuration, and the means of coupling the microwave power to the plasma. These conditions can be interpreted in terms of the processes responsible for particle and power balance for each of the coupled species; namely, electrons, ions, and neutral gas atoms.

Even in idealized point-model approximations of somewhat complete and realistic transport models of the plasma, the interrelated values of the basic plasma parameters characterizing such systems demonstrate several key dependencies. These dependencies identify some of the fundamental obstacles that make it difficult in practice, to achieve large volumes of quiescent, homogeneous, low-temperature plasma containing the desired concentrations of reacting species believed to be essential in various applications, for example, the treatment of specimens such as wafers used for very large scale integration (VLSI) circuits. The applications may include chemical vapor deposition, etching, and cleaning, and more specifically, plasma assisted processing of semiconductor devices with submicron feature sizes.

Basic problems in forming suitable plasmas are noted in the following prior art references. The following discussion of the prior art and the following description of the embodiments of the present invention that is partially based upon a comparison with the prior art, are intended to demonstrate novelty in the method and apparatus of the present invention for overcoming disadvantages and obstacles, such as those generally referred to in the prior art.

In the semiconductor processing applications noted above, plasma sources employing electron cyclotron resonance (ECR) heating comprise an emerging or developing technology, that may be applied for example, in the cleaning, etching, and deposition of materials on very large scale integration (VLSI) wafers. Such applications are typical of other processing technologies requiring the capability of achieving submicron feature dimensions on these wafers, substantial processing rates, and the capability of uniformly processing large specimens. Any such technology must operate in a reproducible manner and be implemented in a cost-effective method. The general characteristics of these technologies are believed to be well understood by those skilled in the art and are accordingly not discussed in substantive detail herein.

Although the ECR plasma source of the present invention is contemplated for use in a wide variety of chemical vapor deposition or etching applications, the general parameters of applications are not a portion of the invention. Certain considerations in such applications are briefly summarized below in order to facilitate a better understanding of the present invention.

ECR plasma sources such as those provided by the present invention and the prior art discussed below employ magnetic fields and microwave power to create chemically active plasmas over a range of gas pressures extending to very low values. Low-pressure operation may be desirable in order to permit the formation of anisotropic, highly directional streams of low-temperature ions, radicals, and other species of reactants which are uniform over transverse dimensions that are substantially larger than the specimen being processed.

In an ECR plasma source designed for plasma-enhanced chemical vapor deposition or reactive ion etching of VLSI wafers for example, a suitable mixture of gases is introduced into an evacuated chamber that is immersed in a suitably configured steady magnetic field and irradiated by electromagnetic radiation. The frequency of the radiation $f_\mu$ is selected to equal the electron gyrofrequency in a region of the steady magnetic field called the resonant interaction region. A resonance condition relates the strength of the steady magnetic field in the resonant interaction region $B_{res}$ to the frequency of the electromagnetic radiation; namely, $f_\mu = eB_{res}/(2\pi m)$, where e is the magnitude of the electric charge and m is the mass of the electron.

Electrons in the resonant interaction region gain kinetic energy from the electromagnetic radiation, and if the radiated power and the gas pressure are suitably adjusted, the heated electrons can ionize the gas molecules to create a plasma. The plasma ions and electrons flow out of the resonant interaction region and impinge on the VLSI wafer, where the ions can deposit new materials, sputter existing materials, or participate in the etching of the existing film. If the plasma density is sufficiently high, the deposition, sputter, or etch rates can be substantially rapid. If the ion energies are sufficiently low, damage to the specimen being processed can be prevented, even if radio frequency (RF) bias of the specimen is employed. For etching narrow, deep, submicron-scale features, it is necessary for the ion trajectories to be highly directional. This is made possible by operating with an RF bias and at sufficiently low gas pressures, to ensure that the mean-free-path for ion scattering is longer than the length of the sheath region separating the specimen from the body of the plasma.

Additionally, if the temperature of the plasma ions is sufficiently low, and if there are no super-thermal groups of energetic ions, the specimen can be biased electrically, relative to the plasma interior for example, by applying RF power to the specimen. In this way, the specimen can be biased electrically to electrostatic potentials large enough to provide highly anisotropic processing, without exceeding a threshold ion energy above which excessive damage to the specimen may occur.

In order to process specimens of commercial interest, it is necessary to insure that the stream of plasma from the ECR source be uniform over transverse dimensions greater than 15 cm to 20 cm. The present invention addresses the need for large, uniform streams of low-temperature plasma, with high densities of ions and electrons in low-pressure mixtures of neutral gases.

In the prior art, one class of ECR plasma sources is generally referred to as a "Sumitomo source". The Sumitomo source is illustrated for example, by a plasma deposition apparatus of Matsuo et al., U.S. Pat. No. 4,401,054, issued Aug. 30, 1983, and further discussed in Ono, M. Oda, C. Takahashi, and S. Matsuo, *J. Vac. Technol.* B4, 696 (1986).

In the apparatus disclosed in U.S. Pat. No. 4,401,054, to Matsuo et al., plasma flows toward the specimen along magnetic lines of force. It is very difficult to achieve a desired degree of spatial uniformity in the plasma density using the disclosed apparatus. Further, since electrons heated in the resonant interaction region flow directly toward the specimen along the magnetic lines of force, it is necessary to limit the applied microwave power in order to avoid the creation of unstable bursts of energetic electrons and associated groups of energetic ions that might damage the specimen being processed.

The physical processes responsible for the generation of these unstable bursts of electrons, together with accompanying super-thermal groups of energetic ions, are discussed in a first reference, a paper by B. H. Quon and R. A. Dandl entitled "Preferential electron-cyclotron heating of hot electrons and formation of overdense plasmas", *Phys. Fluids* B 1 (10) October 1989; a second reference, a paper by G. E. Guest, M. E. Fetzer, and R. A. Dandl entitled "Whistler-wave electron cyclotron heating in uniform and nonuniform magnetic fields", *Phys. Fluids* B 2 (6) June 1990; and a third reference, a paper by R. A. Dandl and G. E. Guest entitled "On the low-pressure mode transition in electron cyclotron heated plasmas", *J. Vac. Sci. Technol.* A 9 (6), November/ December 1991.

Related prior art references include: U.S. Pat. No. 4,492,620, issued Jan. 8, 1985 to Matsuo et al. and entitled "Plasma Deposition Method and Apparatus" and U.S. Pat. No. 4,564,997, issued Jan. 21, 1986, to Matsuo et al. and entitled "Semiconductor Device and Manufacturing Process Thereof". The three preceding U.S. Patents issued under assignment to Nippon Telegraph & Telephone Public Corporation. Additional related references that issued under common assignment include: U.S. Pat. No. 4,450,031, issued May 22, 1984, to Oho et at. and entitled "Ion Shower Apparatus"; U.S. Pat. No. 4,503,807, issued Mar. 12, 1985, to Nakayama et al. and entitled "Chemical Vapor Deposition Apparatus"; and U.S. Pat. No. 4,566,940, issued Jan. 28, 1986, to Itsumi et al. and entitled "Manufacturing Process for Semiconductor Integrated Circuits".

Another design of an ECR plasma source (of a very different fundamental nature) originated in France and is disclosed in U.S. Pat. No. 4,534,842, issued Aug. 13, 1985, to Arnal, et al. and entitled "Process and Device for Producing A Homogeneous Large-Volume Plasma of High Density and Low Electronic Temperature". In the disclosed process and device, plasma is accumulated in a large volume of a very low magnetic field strength, so as to enhance the spatial uniformity of the plasma. However, the resonant interaction region is localized to a small volume in the vicinity of metallic conducting antennas, that are placed close to a wall of a chamber. This approach of coupling the microwave power to the plasma provided limited efficiency for plasma generation and led to excessive generation of metallic impurities.

Various concepts for ion sources are disclosed in a number of U.S. Patents that include: U.S. Pat. No. 3,571,734, issued Mar. 23, 1971; U.S. Pat. No. 3,774,001, issued Nov. 20, 1973; U.S. Pat. No. 3,790,787, issued Feb. 5, 1974; U.S. Pat. No. 4,417,178, issued Nov. 22, 1983; U.S. Pat. No. 4,638,216, issued Jan. 20, 1987; U.S. Pat. No. 3,500,077, issued Mar. 10, 1970; U.S. Pat. No. 3,582,849, issued Jun. 1, 1971; U.S. Pat. No. 3,660,715, issued May 2, 1972; U.S. Pat. No. 3,663,360, issued May 16, 1972; and U.S. Pat. No. 3,742,219, issued Jun. 26, 1973. The above cited prior art, including references cited therein, are incorporated herein by reference in order to insure an understanding of the background of ECR plasma sources and applications therefor.

U.S. Pat. No. 5,370,765 to Dandl, and references cited therein, discloses a method and apparatus where plasmas that are ideally suited to semiconductor processing applications can be created using an ECR plasma source, wherein a unique slotted-waveguide microwave applicator is matched to a novel magnetic configuration to provide spatially distributed, high-field launch of electron cyclotron heating power. Practical embodiments of the disclosed method and apparatus employ microwave power at relatively high frequencies so that the physical size of the applicator and the resulting plasma source match present day processing equipment designed for either 6 or 8 inch wafers. Readily available microwave power sources at frequencies near 6.2 GHz are utilized, together with high energy density permanent magnets, to create the requisite magnetic field strengths in excess of 2.2 kg, which is the cyclotron resonant value, of $B_{res}$, for a microwave frequency $f_\mu$ of 6.2 GHz.

The approach disclosed by Dandl was found to meet the need for an ECR plasma source capable of satisfying the requirements for a variety of applications. The disclosed method and apparatus is capable of producing large, uniform streams of quiescent, low-temperature plasmas with high densities of ions and electrons, especially in low-pressure mixtures of neutral gases so as to yield anistropic, highly directional plasma flow, as well as the desired composition of reactant species. Further, the disclosed approach can be implemented in a wide variety of configurations, including cylindrical and planar, as well as more generally shaped configurations. The chamber walls of the disclosed apparatus may be fabricated from fused quartz, alumina, stainless steel, nickel, aluminum, for example, depending on the specific requirements of the process for which the plasma is to be employed.

However, it would be desirable to employ lower frequency microwave power, such as at the very common microwave frequency of 2.45 GHz. Employing a frequency of 2.45 GHz aids with achieving significant economic benefits that would result from using less expensive or lesser amounts, or both, of lower energy density permanent magnet materials. Further, a frequency of 2.45 GHz would enable the use of less expensive magnetron microwave sources and associated power supplies.

In order to operate at 2.45 GHz, the slotted-waveguide microwave applicator disclosed by Dandl would have to range from 5–8 $in^2$ in cross-sectional area. Such an applicator would be substantially large and bulky, so that the associated magnetic field generating structure would be inefficient and generally unsuited to semiconductor processing applications as they are presently configured. An essential feature of the ECR plasma source disclosed by Dandl is a distributed microwave applicator that is suitably matched to a novel magnetic field configuration. A variant of the slotted-waveguide antenna disclosed by Dandl would be advantageous. In particular, it would be advantageous if the slotted-waveguide antenna could be replaced by a similarly functioning coaxial antenna, the size of the applicator could be reduced to a fraction of an inch in thickness, and the magnetic field generating structures could be made especially efficient as well as optimally effective in generating uniform plasmas.

SUMMARY OF THE INVENTION

It is therefore an object of the present invention to provide a method and apparatus for producing plasma by means of electron cyclotron resonant heating that overcomes one or more of the disadvantages of the prior art, while achieving related advantages.

It is a further object of the present invention to provide a method and apparatus for producing plasma by means of electron cyclotron resonant heating either for use in applications such as chemical vapor deposition and etching or other applications, such as a negative ion source. A plasma source chamber may be formed as a symmetrical cylinder, or other suitable configuration. The chamber has a longitudinal axis with an outlet at one end and means for introducing a gaseous medium into the chamber at the other end. Separate embodiments of the invention are described hereafter, each permitting large volumes of uniform, cold plasma to be generated within the chamber, that may be fabricated from fused quartz or alternatively, may have metal walls.

In a cylindrical configuration, magnetic field forming magnets are arranged circumferentially about the chamber for forming an axisymmetric configuration of magnetic lines of force in the form of axisymmetric annular structures extending continuously and circumferentially about the chamber and for producing axisymmetric resonant interaction regions within the chamber. Within this combination, microwave power is injected into the plasma forming chamber along injection paths extending perpendicularly to a longitudinal axis of the chamber, and preferably in radial relation thereto. Thus, the plasma electrons are made energetic by interaction with the microwave power and are not permitted direct communication along magnetic lines of force to the outlet.

The microwave power is injected using a microwave applicator of the present invention. The novel microwave applicator can be adapted to function in chambers that may be fabricated from dielectrics such as fused quartz, alumina, or various metals, provided that the magnetic field configuration is also modified properly. Additionally, the microwave applicator of the present invention can be used together with large rectilinear arrays of magnets for treating specimens having very large surface areas.

Preferably, the microwave power is injected into the chamber in such manner, that the resulting energetic electrons are caused to experience multiple reflections within magnetic-mirror like magnetic field regions and to precess in the annular magnetic mirror regions formed by the circumferentially arranged magnets. The energetic electrons may alternatively be caused to flow inward as the result of multiple collisions. The precessional motion of electrically charged particles in magnetic mirror configurations is discussed at length in publications such as *Plasmas and Controlled Fusion* by David J. Rose and Melville Clark, Jr., John Wiley and Sons, N.Y., 1961, particularly pp. 198–221. This configuration enhances the probability of collisions between the energetic electrons and neutral gas atoms and thereby results in a substantial increase in the plasma density, even with low gas pressure in the plasma forming chamber. Gas pressure within the plasma forming chamber is preferably maintained in a range from below $10^{-5}$ Torr to above $10^{-3}$ Torr, in order to obtain the desired mixture of reactant species and assure highly directional flow to the specimen, while sustaining adequate density of the plasma.

Within a plasma chamber formed as described above, a region of very low magnetic field strength is preferably formed between the plasma forming chamber and the outlet in order to permit the plasma to achieve uniformity over substantial transverse dimensions. With the plasma source being employed for chemical vapor deposition, etching, or other modes of surface treatment, specimens to be treated are arranged in communication with the outlet so that substantial transverse dimensions containing plasma with high uniformity, are larger than the specimens in order to assure uniform treatment across the entire surface of the specimen.

Thus, the method and apparatus of the present invention have been found to produce a plasma stream having a substantial plasma density resulting in an ion flux or current density greater that has been available in the prior art. Simultaneously, uniformity of plasma distribution for the plasma stream is achieved within the magnetic field-free region. Further, these conditions are achieved over a wide range of gas pressures to permit directional processing with a wide range of control of reactant species, while the plasma source performs these functions in a highly reproducible manner suitable for industrial applications.

Within the above combination, a microwave applicator preferably includes one or more pairs of antenna arrays that are circumferentially arranged about the chamber for producing more uniform and axisymmetric microwave power densities in the resonant interaction regions, than is produced in the prior art. The microwave power is radiated from a region of magnetic intensity that is greater than in the resonant interaction (high field launch) region to permit the formation of high plasma density. The electron plasma frequency characteristic of this dense plasma greatly exceeds the electron gyrofrequency, a condition generally referred to as "over-dense operation", as discussed in the publication by Quon and Dandl for example.

The paired arrays include a plurality of spatially positioned radiating stubs for radiating microwave power. The stubs are positioned along each of the arrays at predetermined intervals for efficiently distributing microwave power uniformly about the periphery of the plasma forming portion. The stubs increase the level of microwave power radiated by the antenna by approximately two to three orders of magnitude over prior art slotted coaxial waveguide antennas. Because of the spacing and orientation of the radiating stubs, each antenna launches a coherent plane wave that propagates with the desired polarization into the resonant interaction region. The efficiency of the arrays enables a microwave applicator, capable of radiating microwave power at frequencies as low as 2.45 GHz, to be used in the present invention. The invented applicator radiates microwave power into suitably distributed resonant interaction regions in a manner similar to that provided at higher microwave frequencies, such as 6.2 GHz, by the slotted waveguide applicators disclosed previously by Dandl.

It is another object of the invention to provide a microwave applicator in a rectilinear array, together with the appropriate magnetic field forming structures for certain applications, particularly, applications where the specimen being treated is not susceptible to damage from energetic charged particles. The microwave applicator of the present invention may be arranged at one surface of a rectilinear chamber, such as those disclosed in the prior art, to preferably place the applicator out of direct communication with magnetic lines of force with the specimen being treated to prevent damage to the specimen, by energetic charged particles from the resonant interaction regions.

Additional features are also preferably employed in the method and apparatus of the present invention to still further enhance the desirable characteristics of the plasma stream produced at the outlet of the chamber, as well as the desirable operating characteristics of the plasma source. For example, the invented microwave applicator is preferably arranged in association with the circumferential magnetic field forming magnet means so that a fraction of the resulting energetic electrons is caused to precess in annular magnetic mirror regions extending continuously and uniformly about the axisymmetric cylindrical chamber. In this manner, energy in the energetic electrons is efficiently transferred to the ambient gas atoms in order to maximize plasma density even with low gas pressure in the chamber. Moreover, selected reactant gasses can be introduced in such a way as to increase substantially the concentration of their ions relative to their neutral atoms by causing that selected reactant gas to flow through the annular magnetic mirror region and then into the central regions of the plasma, which may be largely comprised of different "carrier" gas species, which cannot remove the ions of the reactant gas through resonant charge exchange reactions.

It is still a further object of the present invention to provide a microwave applicator that minimizes the fraction of incident microwave power that is reflected back to the microwave generator. This feature is accomplished by forming the applicator from pairs of antennas that are fed in parallel, but with a separation that insures that reflected power from one antenna will cancel the reflected power from the second, paired antenna. Thus, the method and apparatus of the present invention are capable of producing a plasma stream with an ion current density substantially in excess of 10 milliamperes per square centimeter with high uniformity over transverse dimensions of more that 20 cm, and with very low ion and electron temperatures and no significant densities of super-thermal charged particles.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, in which:

FIG. 4A is a schematic top plan view showing a cylindrical portion of two paired antenna arrays of the slotted coaxial microwave applicator of the present invention in cross-section;

FIG. 4B is a schematic, side elevational view showing the portion of the two paired antenna arrays of FIG. 4A;

FIGS. 5A and 5B are schematic views showing a single radiating stub of the microwave applicator of the present invention; and FIG. 6 is a schematic view showing a microwave power source of the present invention.

DESCRIPTION OF THE PREFERRED EMBODIMENTS

The following description is provided to enable any person skilled in the art to make and use the invention and sets forth the best modes contemplated by the inventor of carrying out the invention. Various modifications, however, will remain readily apparent to those skilled in the art, since the generic principles of the present invention have been defined herein.

Figure 1:
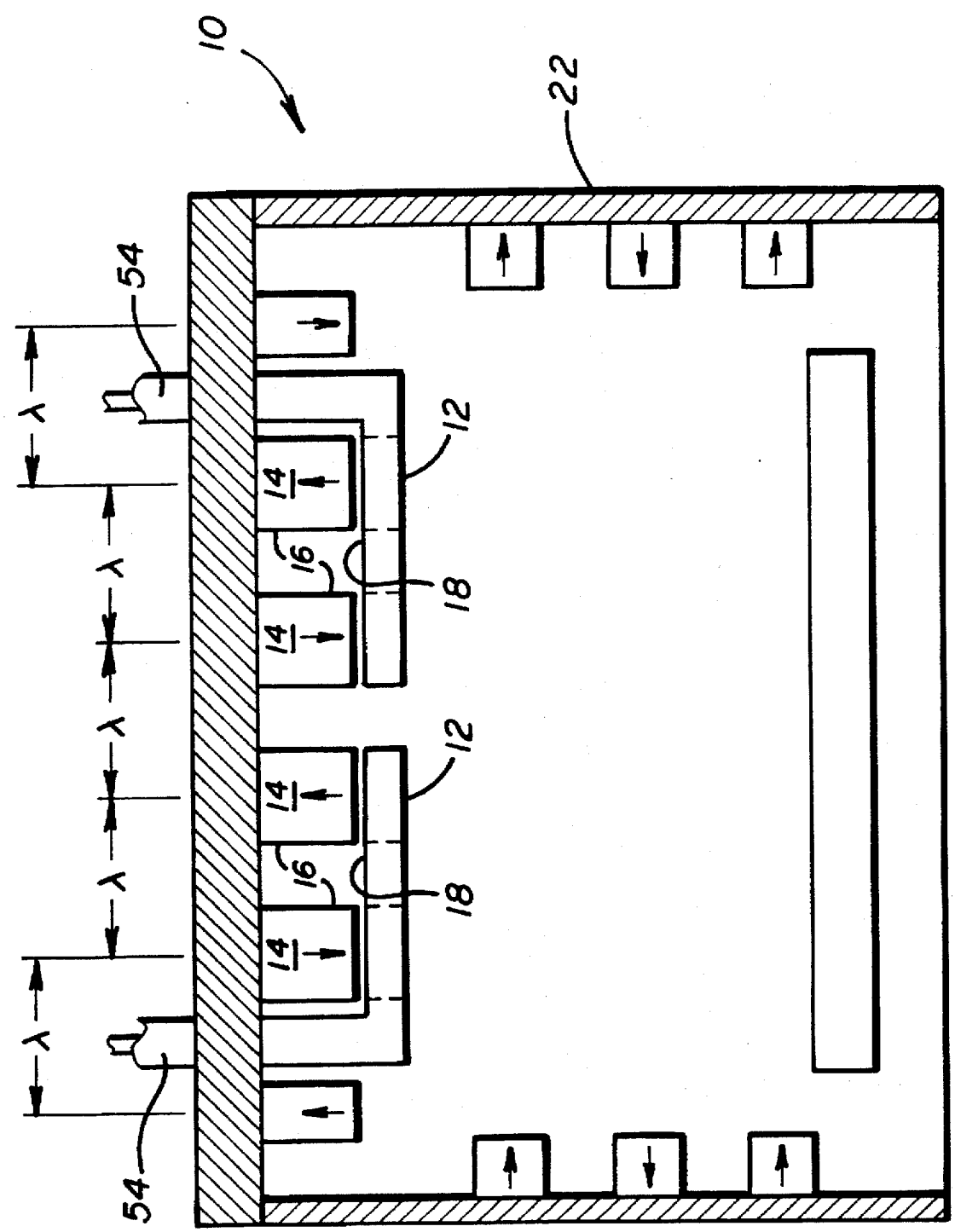
FIG. 1 is a schematic, cross-sectional view showing a prior art rectilinear array plasma source employing a rectilinear embodiment of a slotted coaxial microwave applicator of the present invention.

Referring now to FIG. 1 of the drawings, there is shown a large-area, rectilinear AMPC plasma source 10, having a configuration such as that disclosed in U.S. Pat. No. 5,370,765, to Dandl. The plasma source 10 is shown to illustrate the relation between the size of a microwave applicator 12 constructed according to the principles of the present invention, and magnetic field generating structures. The plasma source 10 includes parallel bars 14 comprising a suitable permanent magnetic material. The magnets 14 have alternating polarities and are spaced so that there is a predetermined distance $\lambda$ between the center of each of the magnets 14. It is well known to those skilled in the art, that the resulting magnetic field strength decreases exponentially with distance from a face 16 of the magnets 14 with a characteristic length equal to $\lambda$: $B(L)=B(0) \exp(-L/\lambda)$; where $B(L)$ is the magnetic field strength at a distance L from the face 16 of the magnet 14, and $B(0)$ is the magnetic field strength at the face 16 of the magnet 14. For optimal functioning of the microwave applicator 12, it is desirable to have the position of the magnetic field strength at resonance (875 Gauss for 2.45 GHz microwave power), located at least 2 cm from a face 18 of the applicator 12, so that the magnetic field strength at the face 18 of the applicator 12 is higher than the resonant value by 1.5 to 2 times. If the thickness of the applicator 12 is approximately 1 cm, and if the characteristic length $\lambda$ is approximately 3 cm, the desired location of a resonant region (discussed hereafter) is achieved. Further, for these dimensions, the magnetic field strength drops to low values at a distance greater than 10 cm from the face 16 of the magnets 14, so that the plasma can flow into a virtually magnetic-field free region (also discussed hereafter) and spread freely for spatial uniformity.

Figure 2:
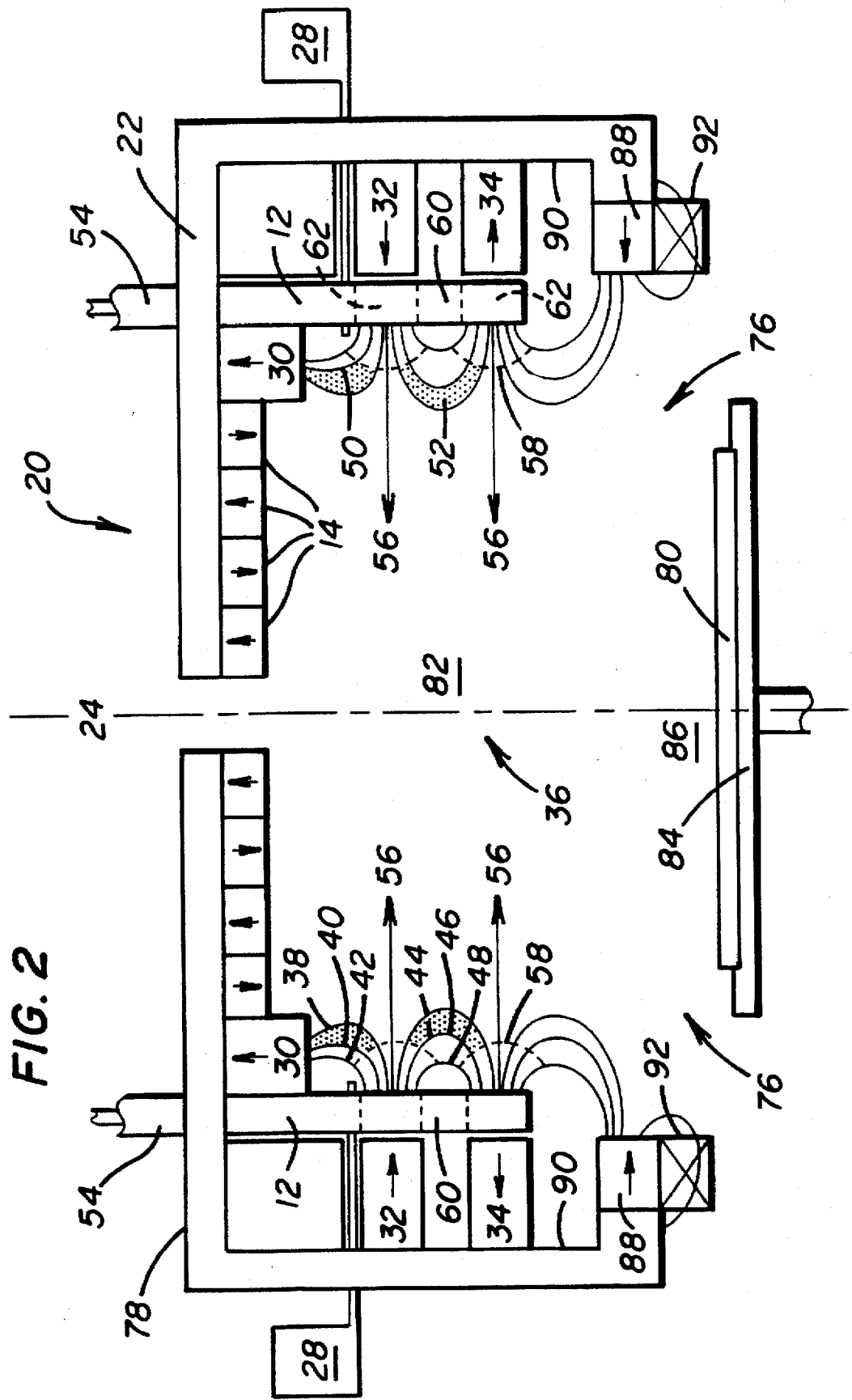
FIG. 2 is a schematic, cross-sectional view showing a cylindrical plasma forming chamber embodying the slotted coaxial microwave applicator constructed in accordance with the present invention.

Referring now to FIG. 2 of the drawings, there is shown a first embodiment of a novel electron cyclotron resonance plasma source 20 constructed according to the principles of the present invention and employing the novel slotted coaxial microwave applicator 12. The plasma source 20 of the present invention is contemplated for producing a large diameter stream of uniform, low-temperature plasma over a wide rage of preferably low gas pressures in a chamber 22.

The plasma source 20 comprises the chamber 22 that is cylindrical and axisymmetric about its longitudinal axis 24. Neutral reactant gas mixtures are introduced into the chamber 22 from conventional sources 26, that may be directed through an annular layer of precessing energetic electrons. Alternatively, the reactant gas may be introduced into other parts of the chamber 22 in order to control the relative concentrations of reactant species of ions, radicals, or other active components of the gas and plasma medium.

The chamber 22 is also provided with high-speed vacuum pumps, schematically indicated at 28, adapted for maintaining a predetermined gas pressure within the chamber 22. Alternative embodiments of the plasma source 20 that employ dielectric liners such as fused quartz or alumina, are not shown, but can be readily constructed by those skilled in the art. The rectilinear plasma source 10 (shown in FIG. 1) is similarly fitted with vacuum pumping means and means for supplying suitable gas mixtures to the chamber 22.

An axisymmetric configuration of magnetic lines of force is formed within the chamber 22 by a plurality of cylindrical arrays of permanent magnets 30. Two ring-shaped cylindrical permanent magnet assemblies 32, 34 are arranged about the circumference of a plasma forming portion 36. The magnet assemblies 32, 34 develop axisymmetric configurations of magnetic lines of force having the form of somewhat annular, cylindrical lobes. By way of illustration only, three magnetic lines of force in such an annular lobe are indicated at 38, 40, and 42 for a first one of the cylindrical magnetic assemblies 32. Similar magnetic lines of force 44, 46, and 48 are illustrated for the other cylindrical magnetic assembly 34. It is important to note that the magnetic assemblies 32, 34 are cylindrical and generally axisymmetric about the circumference of the chamber 22, so that each adjacent pair of lobed magnetic lines of force, 38, 40 and 44, 46 form annular magnetic mirror regions 50, 52. The annular magnetic mirror regions 50, 52 are shown with cross hatching in order to emphasize the locations of these regions 50, 52.

A microwave power source 54, also shown in FIG. 6, is positioned in front of the magnet assemblies 32, 34 and adjacent to the plasma forming portion 36 of the chamber 22. Preferably, the microwave power source 54 is provided with the slotted coaxial microwave applicator 12. The applicator 12 comprises four pairs of annular sectors of slotted coaxial antenna arrays, discussed thoroughly hereafter. Microwave power is introduced into the plasma forming portion 36 of the chamber 22 through the applicator 12. The microwave power is introduced into the plasma forming portion 36 along a plurality of radial injection axes 56, that extend perpendicular to the longitudinal axis 24 of the chamber 22.

The slotted or multiple-aperture coaxial microwave applicator 12 causes the microwave power to be uniformly introduced about the entire periphery of the plasma forming portion 36 of the chamber 22. Additionally, due to the axisymmetric construction of the chamber 22, the injection axes 56 are each radially arranged relative to the longitudinal axis 24 of the chamber 22. The magnetic intensity decreases from a local maximum, at the location of the applicator 12, to a resonant interaction region 58 (discussed hereafter), so as to permit over-dense plasma operation.

Referring now to FIGS. 3, 4A, 4B, and 6 of the drawings, a novel element of the present invention is the design of the applicator 12 that comprises a pair of coaxial antenna arrays shown generally at 60 coupled to the power source 54. The antenna array 60 can be configured as a distributed microwave applicator for magnetic configurations of the types disclosed previously by Dandl, that is, cylindrical configurations with ring cusp magnetic fields, and planar configurations with line cusp magnetic fields.

An essential design element of the slotted coaxial antenna array 60 is the geometric configuration of individual radiating stubs 62, that are formed in slots 63 in an outer conductor 64 of a coaxial line or coaxial waveguide 66 coupled to the power source 54, together with the spacing of successive stubs 62. It is well known that a simple transverse slot 63 in the outer conductor 64 of the coaxial line 66 will radiate only a small fraction of the power coupled into the line 66, since the longitudinal currents induced in the conducting wall by the TEM transmission line modes will simply flow around the slot 63. Thus, a transverse slot 63 is a very inefficient radiator, since the current induced in the conducing wall by the TEM mode flows around both ends of the slot 63 and largely shorts out any electric field that appears across the slot 63.

The individual radiating stub 62 of the present invention however, employs the more complex structure shown schematically in the Figures, and increases the power typically radiated by the slot 63 by two to three orders of magnitude. Radiation from the stub 62 is polarized linearly with an electric field E that extends parallel to the coaxial line 66, and a magnetic field H extending perpendicular to the coaxial line 66. By employing a plurality of stubs 62 in an array 60 of the form shown, having properly chosen size and spacing, and with a suitable termination, a resonant antenna structure suitable for use as a distributed microwave applicator 12 is readily realizable. This structure launches electromagnetic fields in the form of coherent plane waves.

Figure 3:
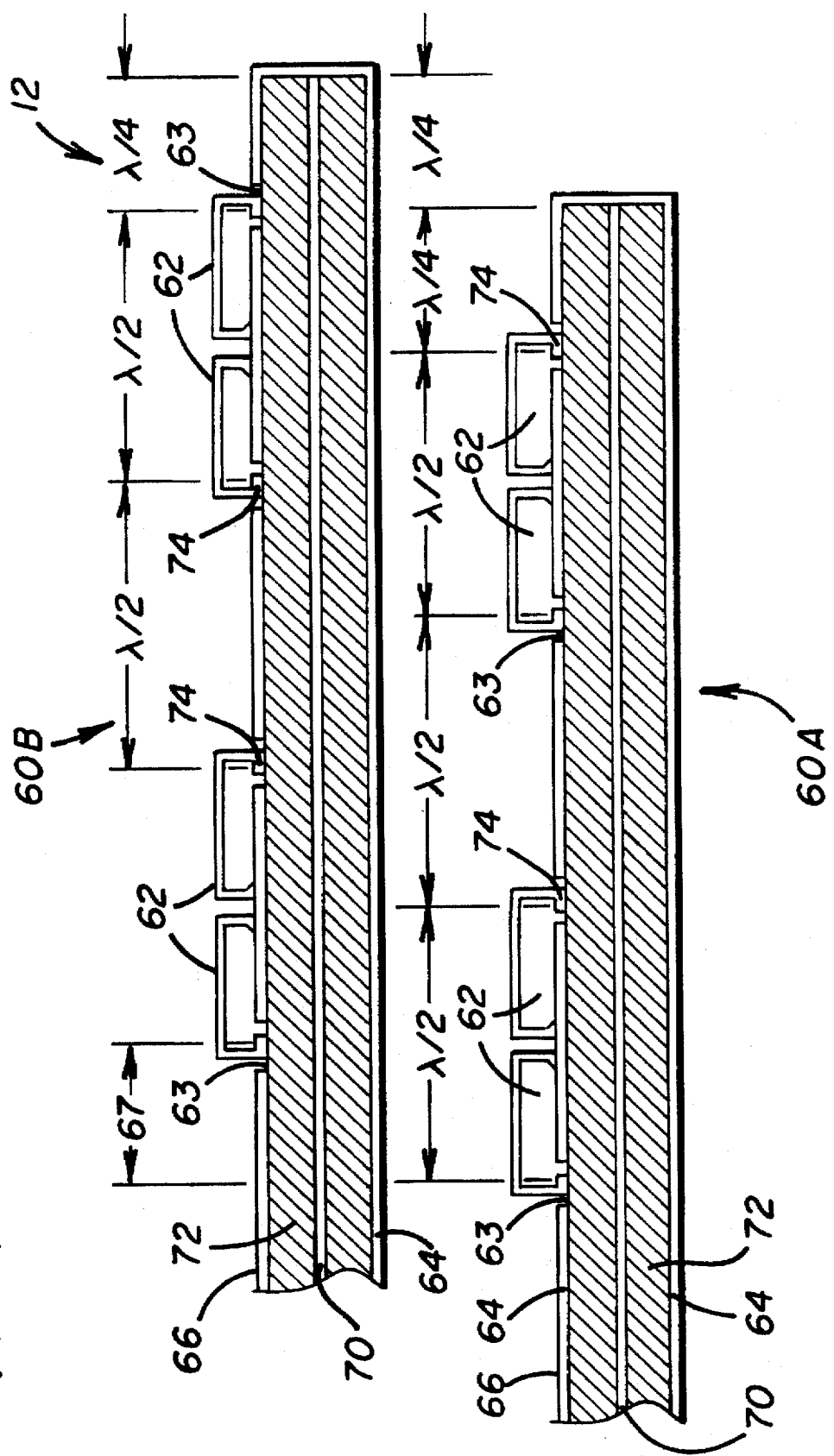
FIG. 3 is a schematic, fragmentary representation of a single quadrant of the slotted coaxial microwave applicator of the present invention.

Referring now to FIGS. 3, 5A, and 5B, one possible configuration of a pair of antenna arrays 60A, 60B is shown. On each of the arrays 60A, 60B, pairs of the stubs 62 are separated by one half wavelength $\lambda/2$. Microwave power is supplied to each array 60A, 60B using the coaxial line 66 coupled to the power source 54. The line 66, which may be somewhat rectilinear, passes through a suitable penetration of the mild steel shell comprising the outer shell of the chamber 22. Each microwave source or waveguide 66 supplies power to two antenna arrays 60A, 60B. Additionally, the stubs 62 may be configured with a non-magnetic boss 73 to provide structural support for the stub 62. The boss 73 preferably comprises a non-magnetic stainless steel and is affixed to the outer conductor 64 by brazing, for example.

The two arrays 60A, 60B shown, represent one of four identical quadrants 68 that, taken together, distribute microwave power uniformly around the circumference of the plasma source 20. Two antenna arrays 60A, 60B are connected in parallel to comprise a quadrant 68 of the applicator 12. Each coaxial line 66 is provided with the outer conductor 64, an inner conductor 70, each of which may comprise copper for example, and a dielectric medium 72 filling the space between the outer 64 and inner 70 conductors. Spacers 71 that comprise a suitable dielectric material, such as polytetrafluorethylene, are interposed between the inner conductor 70 and outer conductors 64. The spacers 71 may be provided for maintaining the distance between the conductors 64, 70. The pairs of radiating stubs 62 are formed at half-wavelength $\lambda/2$ intervals along each leg of the quadrant 68. A coupling element 74 is provided for electrically coupling the stubs 62 to the dielectric medium 72. Further, one or more dielectric tuning plates 75 may be optionally provided for fine tuning the dielectric strength of the line 66. The resonant frequency of the antenna can thereby be matched to the microwave generator.

Note that the pairs of radiating stubs 62 on one of the antenna arrays 60A are offset a distance equal to one quarter wavelength $\lambda/4$, relative to their corresponding stubs 62 on a second antenna array 60B of the pair 60A, 60B. It is apparent that if the length of a coupling portion 67 of the coaxial line 66 connecting the two antenna arrays 60A, 60B in parallel, is also equal to one quarter wavelength $\lambda/4$, microwave power reflected by the plasma back into the two antenna arrays 60A, 60B will be 180° out of phase at the feed point and will, therefore, interfere in a manner similar to that achieved by the hybrid coupler disclosed in U.S. Pat. No. 5,370,765.

Referring again to the drawing Figures, and particularly to FIG. 2, before describing the interaction of the microwave power with electrons magnetized by the magnetic field of the resonant interaction zone 58 in greater detail, it is noted that an outlet 76 is provided at one end of the chamber 22. The other end of the chamber 22 is enclosed with an end wall 78. A plurality of permanent magnet arrays 14 are provided for forming conventional magnetic insulation for the wall 78, while assisting in developing the magnetic field within the plasma forming portion 36 of the chamber 22, with the desired central field-free region.

With the microwave power source 54 arranged as described above, it is important to note that, electrons formed and heated by interaction of the microwave power with background plasma existing in the chamber 22, are prevented from flowing freely along the magnetic lines of force, such as 38, 40, and 42, directly to a specimen 80 being treated. Rather, energetic electrons heated by the microwave power may be considered in two classes. A first class of heated electrons tends to enter a central region 82 of the plasma forming portion 36. The first class of heated electrons impinge on the magnetic lines of force 38, 40, 42, and tend to bounce back and forth laterally within the plasma forming portion 36. The electrons move laterally within the portion 36, until they eventually collide with neutral gas atoms, degrade in energy, and assist in increasing the density of the cold plasma.

A second class of heated electrons is dependent upon the arrangement of the microwave power source 54 adjacent to the two cylindrical magnet assemblies 32, 34. The second class of energetic electrons is confined within the magnetic mirror regions 50, 52. Due to the continuous annular, axisymmetric nature of the magnetic mirror regions 50, 52, energetic electrons in the so-call second class, travel continuously about the annular path formed by the mirror regions 50, 52. The motion of the energetic electrons is referred to as "precession" to those skilled in the art. These energetic electrons precessing about the circumference of the plasma forming portion 36, in the annular magnetic mirror regions 50, 52 tend to remain trapped in these regions 50, 52 until they collide with neutral gas atoms. When the electrons collide with the gas atoms, they transfer energy through inelastic collisions, that result in ionization or excitation of the gas atoms thereby, contributing to the density of plasma in the plasma forming portion 36. Simultaneously, some of the electrons gradually flow into the central region 82 through transport mechanisms as described in the above noted U.S. Patent to Dandl.

The axisymmetric configuration of the cylindrical chamber 22, together with the similarly axisymmetric cylindrical magnetic assemblies 32, 34 and the similar axisymmetric distribution of microwave power by the novel applicator 12, yield high efficiency in converting microwave power into cold plasma. The axisymmetric configuration of the chamber 22, magnetic assemblies 32, 34, and distribution of power, inhibits the direct flow of energetic electrons along magnetic lines of force 38, 40, 42 to the specimen 80 being treated.

The plasma source 20 is preferably adapted for use in such applications as chemical vapor deposition, etching, sputtering, sputter cleaning, or similar types of surface treatment of the specimen 80. The specimen 80 is arranged upon a suitable platform or holder 84 in communication with the outlet 76. At the same time, a magnetic field-free region 86 is formed in the chamber 22, intermediate the plasma forming portion 36 and the outlet 76. Insulating magnets 88 are additionally arranged about the circumference of the magnetic field-free region 86, to prevent plasma in the region 86 from colliding with adjacent wall portions 90 of the chamber 22. The magnets 88 further reduce the central interior magnetic field strength to sufficiently low values. Additionally, an electromagnetic coil 92 may be employed with a suitable external source of steady electric power to make fine adjustments in the magnetic field strength in the magnetic field-free region 86.

In accordance with conventional electron cyclotron heating practice, the microwave source 54 and the magnet assemblies 32, 34 are adapted for producing the resonant interaction region 58. The resonant interaction region 58 extends substantially in the plasma forming portion 36, in front of the paired antenna arrays 60 of the applicator 12. It is to be understood, that electrons passing through the resonant interaction region 58 absorb energy from the microwave fields radiated by the stubs 62 of the applicator 12, and thereby become energetic. Generally, the first class of electrons tends to pass through the resonant interaction region 58 only once and thereafter tend to remain in the central region 82 of the plasma forming portion 36, until interacting with gas atoms, as previously described.

The second class of energetic electrons, which precess in the annular magnetic mirror regions 50, 52, have their energies further increased, since they are able to pass through the resonant interaction region 58 numerous times, while precessing about the circumference of the chamber 22. For that reason, the magnet assemblies 32, 34 are designed so that the resonant interaction region 58 preferably intersects the mirror regions 50, 52, in a manner that enhances is the heating of the energetic electrons. The cylindrical magnetic assemblies 32, 34 are also preferably configured for closing their associated magnetic field lines more tightly about the assemblies 32, 34 to increase the mirror ratio and minimize the loss of energetic electrons through the magnetic mirror regions 50, 52.

It is generally believed that the mode of operation of the plasma source 20 and microwave applicator 12 of the present invention will be apparent to those skilled in the art from the preceding description. However, the method of operation is described briefly hereafter, in order to facilitate a complete understanding of the present invention.

Referring again to FIG. 2 of the drawings, in operation, energetic electrons are initially formed by interaction of microwave power from the power source 54 with background plasma and neutral gas present in the plasma forming portion 36 of the chamber 22. The two classes of energetic electrons are formed as described above, both of which are prevented from flowing directly along magnetic lines of force, such as 44, 46, 48, to the specimen 80 being treated on the holder 84. Due to the design of the chamber 22, the magnetic assemblies 32, 34, and the microwave power source 54, high efficiency is accomplished in the conversion of energy stored in energetic electrons into high-density cold plasma. With low gas pressure being maintained in the chamber 22, plasma flow to the specimen 80 can be unidirectional and the relative concentrations of reactant species can be optimized for each specified process.

As cold plasma flows from the plasma forming portion 36 toward the outlet 76, plasma passes through regions of progressively weaker magnetic field strength into the magnetic field-free region 86. In that region 86, because of the low value of magnetic pressure, the cold plasma expands freely transverse to the longitudinal axis 14 of the chamber 22, and becomes uniform in density as it approaches the outlet 76. Thus, as plasma flows through the magnetic field-free region 86 toward the outlet 76, it is characterized not only by high density, but also by uniformity of plasma density and temperature, to enhance the uniformity of the processing specimen 80.

It is to be understood that in carrying out the desired process, additional reactant gases may be introduced either with an inert "carrier" gas, separately from behind the annular resonant interaction region 58, or in the magnetic field-free region 86 in ways that may be chosen to optimize the process. Control of the pressure over the wide range of operations possible with the present invention, permits desired concentrations of the reactant plasma species to be achieved and to reach the specimen 80 being treated. Further, it is to be understood that a method for generating plasma by electron cyclotron heating in accordance with the present invention, may be useful in other applications. For example, the plasma source of the present invention may also be used as a negative ion source with substantially all components of the plasma source being substantially similar to those described herein. Other related applications are also possible using the method and apparatus of the present invention.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A plasma source embodying a coaxial microwave applicator comprising:

a chamber that is symmetrical about its longitudinal axis, a plasma forming portion being formed along the longitudinal axis of the chamber;

means for supporting a specimen adjacent one axial end of the chamber;

means for introducing a gaseous medium into the chamber;

magnet assemblies arranged about the chamber, the magnet assemblies generating a magnetic field having lines of force forming lobes extending about the chamber and a resonant interaction region that extends along the longitudinal axis of the chamber and surrounds the plasma forming portion;

means for developing a substantially magnetic-field free region adjacent to the axial end of the chamber while minimizing the extension of magnetic field force lines into the magnetic field free region and toward the specimen;

a coaxial microwave power applicator interposed between the magnet assemblies and the plasma forming portion, the applicator comprising at least one pair of multiple aperture coaxial antenna arrays having an injection axis extending inwardly toward the plasma forming portion and perpendicular to the longitudinal axis of the chamber for uniformly radiating electromagnetic radiation toward the plasma forming portion of the chamber, each of the antenna arrays including a plurality of radiating stubs coupled to the coaxial transmission line through the apertures for radiating the electromagnetic radiation; and means for maintaining a gas pressure in the chamber.

2. The plasma source of claim 1 wherein electromagnetic radiation is radiated from the radiating stubs to interact with the gaseous medium in the chamber to form a plasma stream that flows through the plasma forming region toward the specimen with characteristics of high plasma density, uniformity of plasma density over a transverse dimension greater than the specimen, low plasma temperature, and absence of energetic particles.

3. The plasma source of claim 1 wherein the gas pressure in the chamber ranges from approximately $10^{-3}$ Torr to approximately $10^{-5}$ Torr.

4. The plasma source of claim 1 wherein each of the antenna arrays comprises a coaxial line coupled to a microwave power source, a plurality of the radiating stubs spatially positioned along the line to form the antenna array, the stubs positioned along the line, such that two of the stubs are positioned adjacent to each other to form a pair of stubs having a length with a distance between adjacent pairs of stubs substantially equal to the length of a pair of stubs, wherein electromagnetic radiation is radiated from the radiating stubs to interact with gaseous medium in the chamber to form a plasma stream that flows through the plasma forming portion toward the specimen with characteristics of high plasma density, uniformity of plasma density over a transverse dimension greater than the specimen, low plasma temperature, and absence of energetic particles resulting from plasma instabilities with operating gas pressures ranging from substantially $10^{-3}$ Torr to substantially $10^{-5}$ Torr.

5. The plasma source of claim 4 wherein the distance between adjacent pairs of stubs and the length of a pair of stubs is one half wavelength of microwave power applied to the array.

6. A plasma source embodying a coaxial microwave applicator comprising:

a chamber that is symmetrical about its longitudinal axis, a plasma forming portion being formed along the longitudinal axis of the chamber;

means for supporting a specimen adjacent one axial end of the chamber;

means for introducing a gaseous medium into the chamber;

magnet assemblies arranged about the chamber, the magnet assemblies generating a magnetic field having lines of force forming lobes extending about the chamber and a resonant interaction region that extends along the longitudinal axis of the chamber surrounds the plasma forming portion;

means for developing a magnetic wall having an interior magnetic-field free region adjacent to the axial end of the chamber, the magnetic wall minimizing the extension of magnetic field force lines into the magnetic field free region and toward the specimen;

a coaxial microwave power applicator interposed between the magnet assemblies and the plasma forming portion, the applicator comprising at least one pair of multiple aperture coaxial antenna arrays having an injection axis extending inwardly toward the plasma forming portion and perpendicular to the longitudinal axis of the chamber for uniformly radiating electromagnetic radiation toward the plasma forming portion of the chamber, each of the antenna arrays including a plurality of radiating stubs coupled to the coaxial transmission line through the apertures for radiating the electromagnetic radiation; and means for maintaining a gas pressure in the chamber.

7. An electron cyclotron resonance (ECR) plasma source plasma source embodying a coaxial microwave applicator, the plasma source for use in treating specimens by processes including etching and chemical vapor deposition, comprising:

a chamber that is symmetrical about its longitudinal axis, a plasma forming portion being formed along the longitudinal axis of the chamber;

means for supporting a specimen adjacent one axial end of the chamber;

means for introducing a gaseous medium into the chamber;

a pair of magnet assemblies arranged about the chamber, each of the magnet assemblies generating a continuous and symmetrical magnetic field having lines of force that form continuous annular lobes extending about the chamber and a continuous resonant interaction region that extends along the longitudinal axis of the chamber and surrounds the plasma forming portion;

means for developing a substantially magnetic-field free region adjacent to the one axial end of the chamber while minimizing extension of magnetic field force lines into the magnetic field free region and toward the specimen;

a coaxial microwave power applicator interposed between the magnet assemblies and the plasma forming portion, the applicator comprising at least one pair of multiple aperture coaxial antenna arrays having an injection axis extending inwardly toward the plasma forming portion and perpendicular to the longitudinal axis of the chamber for uniformly radiating electromagnetic radiation toward the plasma forming portion of the chamber, each of the antenna arrays including a plurality of radiating stubs coupled to the coaxial transmission line through the aperatures for radiating the electromagnetic radiation; and means for maintaining a gas pressure in the chamber, wherein electromagnetic radiation is radiated from the radiating stubs to interact with gaseous medium in the chamber to form a plasma stream that flows through the plasma forming portion toward the specimen with characteristics of high plasma density, uniformity of plasma density over a transverse dimension greater that the specimen, low plasma temperature, and absence of energetic particles.

8. The ECR plasma source of claim 7 wherein the low gas pressure in the chamber ranges from approximately $10^{-3}$ to approximately $10^{-5}$ Torr.

9. The ECR plasma source of claim 7 wherein the chamber is cylindrical and the magnet assemblies are cylindrical and arranged circumferentially about the chamber, each of the magnet assemblies generating a circumferentially continuous and symmetrical magnetic field that has lines of force forming continuous annular lobes also circumferentially extending about the chamber.

10. The ECR plasma source of claim 7 wherein each of the antenna arrays comprises a coaxial line coupled to a microwave power source, a plurality of the radiating stubs spatially positioned along the line to form the antenna array, the stubs positioned along the line, stub that two of the stubs are positioned adjacent to each other to form a pair of stubs having a length with a distance between adjacent pairs of stubs substantially equal to the length of a pair of stubs.

11. The ECR plasma source of claim 10 wherein the distance between adjacent pairs of stubs and the length of a pair of stubs is one half wavelength of microwave power applied to the array.

12. The ECR plasma source of claim 11 wherein the plurality of radiating stubs on one of the arrays of a paired antenna array is offset one quarter wavelength relative to corresponding stubs on the other array of the paired antenna array, and a coupling portion of the line connecting the paired antenna arrays to the microwave power source is one quarter wavelength to cancel microwave electromagnetic radiation reflected by plasma in the plasma forming portion back into the paired antenna arrays.

13. The ECR plasma source of claim 10 wherein the microwave power source radiates electromagnetic radiation at a frequency of approximately 2.45 GHz.

14. The ECR plasma source of claim 10 wherein the paired antenna arrays are formed in an arcuate configuration.

15. The ECR plasma source of claim 14 wherein the paired antenna arrays each comprise one quadrant of the microwave applicator and the applicator comprises four such quadrants.

16. The ECR plasma source of claim 7 wherein the chamber comprises a metal alloy.

17. An electron cyclotron resonance (ECR) plasma source embodying a coaxial microwave applicator, the plasma source for use in treating specimens by processes including etching and chemical vapor deposition, comprising:

a cylindrical chamber that is symmetrical about its longitudinal axis, a plasma forming portion formed in the chamber along the longitudinal axis thereof;

means for supporting a specimen adjacent one axial end of the chamber;

means for introducing a gaseous medium into the chamber;

a pair of cylindrical magnet assemblies arranged circumferentially about the chamber, each of the magnet assemblies generating a circumferentially continuous and symmetrical magnetic field having lines of force that form continuous annular lobes also circumferentially extending about the chamber and a continuous resonant interaction region that encircles the plasma forming portion along the longitudinal axis of the chamber;

means for developing a substantially magnetic-field free region adjacent the one axial end of the chamber while minimizing extension of magnetic field force lines into the magnetic field free region and toward the specimen;

a coaxial microwave power applicator interposed between the magnet assemblies and the plasma forming portion, the applicator comprising a plurality of pairs of multiple aperture coaxial antenna arrays, each formed in an arcuate configuration, the paired antenna arrays each having multiple injection axis extending radially inwardly toward the plasma forming portion and perpendicular to the longitudinal axis of the chamber for uniformly radiating electromagnetic radiation toward the plasma forming portion of the chamber, each of the antenna arrays including a plurality of radiating stubs for radiating the electromagnetic radiation, the stubs spatially positioned along the array for distributing microwave electromagnetic radiation uniformly about the plasma forming portion, the stubs positioned along the arrays such that two of the stubs are positioned adjacent to each other to form a pair of stubs having a length with a distance between adjacent pairs of stubs substantially equal to the length of a pair of stubs; and means for maintaining low gas pressure in the chamber;

wherein electromagnetic radiation is uniformly radiated from the antenna arrays to interact with gaseous medium in the chamber to form a plasma stream that flows undirectionally through the plasma forming region toward the specimen with characteristics of highly density, uniformity over transverse dimensions larger than the specimen, low plasma temperature, and absence of energetic particles resulting from plasma instabilities with operating gas pressures ranging from substantially $10^{-3}$ Torr to substantially $10^{-5}$ Torr.

18. The ECR plasma source of claim 17 wherein each of the paired antenna arrays further comprises a coaxial line coupled to a microwave power source, the line having a slotted outer conductor with the stubs being formed in the slots so that the radiating stubs radiate microwave electromagnetic radiation from approximately two to approximately three orders of magnitude greater than microwave electromagnetic radiation radiated by the slots in the coaxial line.

19. The ECR plasma source of claim 17 wherein the distance between adjacent pairs of stubs and the length of a pair of stubs is one half wavelength of microwave power applied to the array, and wherein the plurality of radiating stubs on one of the arrays of a paired antenna array is offset one quarter wavelength relative to corresponding stubs on the other array of the paired antenna array, and a coupling portion of the line connecting the paired antenna arrays to the microwave power source is one quarter wavelength to cancel microwave electromagnetic radiation reflected by plasma in the plasma forming portion back into the paired antenna arrays.

20. The ECR plasma source of claim 18 wherein the microwave power source radiates electromagnetic radiation at a frequency of approximately 2.45 GHz.

21. The ECR plasma source of claim 17 wherein the paired antenna arrays each comprise one quadrant of the microwave applicator and the applicator comprises four quadrants.

22. The microwave applicator of claim 18 further comprising means for matching a resonant frequency of electromagnetic radiation radiated by the antenna arrays to the frequency of microwave power provided by the microwave power source.

23. A method of generating plasma by electron cyclotron resonance (ECR) heating to treat specimens by processes including surface treatments, the method comprising the steps of:

forming a cylindrical chamber that is symmetrical about its longitudinal axis, a plasma forming portion being formed along the longitudinal axis of the chamber;

introducing a gaseous medium into the chamber;

maintaining low gas pressure in the chamber;

supporting a specimen adjacent one axial end of the chamber;

generating a circumferentially continuous and symmetrical magnetic field having lines of force that form continuous annular lobes also circumferentially extending about the chamber and a continuous resonant interaction region that encircles the plasma forming portion along the longitudinal axis of the chamber; and uniformly radiating the plasma forming portion with microwave electromagnetic radiation by forming an annular applicator comprising a plurality of pairs of multi-aperture coaxial antenna arrays, each having multiple injection axis extending radially inwardly toward the plasma forming portion and perpendicular to the longitudinal axis of the chamber, each of the antenna arrays including a plurality of radiating stubs spatially positioned along the arrays, such that two of the stubs are positioned adjacent to each other to form a pair of stubs having a length with a distance between adjacent pairs of stubs equal to the length of a pair of stubs for distributing microwave electromagnetic radiation uniformly about the plasma forming portion for developing a plasma stream that flows undirectionally through the plasma forming portion toward the specimen with characteristics of high density, uniformity over transverse dimensions larger than the specimen, low plasma temperature, and absence of energetic particles resulting from plasma instabilities with operating gas pressures ranging from substantially $10^{-3}$ Torr to substantially $10^{-5}$ Torr.

24. In an electron cyclotron resonance (ECR) plasma for applications such as treating specimens by processes including etching and chemical vapor deposition, the source including a cylindrical chamber that is symmetrical about its longitudinal axis, a plasma forming portion formed along the longitudinal axis of the chamber, means for supporting a specimen adjacent one axial end of the chamber, a pair of cylindrical magnet assemblies arranged circumferentially about the chamber, each of the magnet assemblies generating a circumferentially continuous and symmetrical magnetic field having lines of force that form continuous annular lobes also circumferentially extending about the chamber and a continuous resonant interaction region that encircles the plasma forming portion along the longitudinal axis of the chamber, a microwave power applicator interposed between the magnet assemblies and the plasma forming portion, the applicator comprising:

a plurality of pairs of multi-aperture coaxial antenna arrays, each formed in an arcuate configuration, each paired antenna arrays having multiple injection axis extending radially inwardly toward the plasma forming portion and perpendicular to the longitudinal axis of the chamber for uniformly radiating electromagnetic radiation toward the plasma forming portion of the chamber, each of the antenna arrays comprising, a coaxial line coupled to a microwave power source for providing microwave power at a frequency of approximately 2.45 GHz, the line having a multiple aperture outer conductor, and a plurality of radiating stubs for radiating the electromagnetic radiation, the stubs formed in the apertures in the outer conductor and spatially positioned along the line at predetermined intervals for distributing microwave electromagnetic radiation uniformly about the plasma forming portion, the stubs positioned along the line, such that two of the stubs are positioned adjacent to each other to form a pair of stubs having a length with a distance between adjacent pairs of stubs substantially equal to the length of a pair of stubs, the distance between adjacent pairs of stubs and the length of a pair of stubs being one half wavelength of the microwave power applied to the array, the radiating stubs formed in the apertures so that the stubs radiate microwave power from approximately two to approximately three orders of magnitude greater than microwave power radiated by the apertures in the coaxial line, wherein electromagnetic radiation is uniformly radiated from the radiating stubs of the antenna arrays to interact with gaseous medium in the chamber to form a plasma stream that flow indirectionally through the plasma forming portion toward the specimen with characteristics of high density, uniformity over transverse dimensions larger than the specimen, low plasma temperature, and absence of energetic particles resulting from plasma instabilities with operating gas pressures ranging from substantially $10^{-3}$ Torr to substantially $10^{-5}$ Torr.

25. The microwave applicator of claim 24 wherein the plurality of radiating stubs on one of the arrays of a paired antenna array is offset one quarter wavelength relative to corresponding stubs on the other array of the paired antenna array, and a coupling portion of the line connecting the paired antenna arrays to the microwave power source is one quarter wavelength to cancel microwave electromagnetic radiation reflected by plasma in the plasma forming portion back into the paired antenna arrays.

* * * * *